(12) United States Patent
Li

(10) Patent No.: US 11,723,158 B2
(45) Date of Patent: Aug. 8, 2023

(54) ELECTRONIC DEVICE WITH STORAGE FUNCTIONALITY

(71) Applicant: Shannon Systems Ltd., Shanghai (CN)

(72) Inventor: Jiangshan Li, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 113 days.

(21) Appl. No.: 17/476,694

(22) Filed: Sep. 16, 2021

(65) Prior Publication Data

US 2022/0377914 A1 Nov. 24, 2022

(30) Foreign Application Priority Data

May 18, 2021 (CN) .......................... 202121067311.1

(51) Int. Cl.
  *H05K 5/00* (2006.01)
  *H05K 5/02* (2006.01)

(52) U.S. Cl.
  CPC ........... *H05K 5/003* (2013.01); *H05K 5/0008* (2013.01); *H05K 5/0021* (2013.01); *H05K 5/0052* (2013.01); *H05K 5/0065* (2013.01); *H05K 5/0221* (2013.01)

(58) Field of Classification Search
  CPC .... H05K 5/003; H05K 5/0008; H05K 5/0021; H05K 5/0052; H05K 5/0065; H05K 5/0221; G11B 33/025; G06F 1/187; G06F 1/183
  See application file for complete search history.

(56) References Cited

U.S. PATENT DOCUMENTS

| | | | |
|---|---|---|---|
| 10,477,706 B1 * | 11/2019 | Wang | H05K 5/0008 |
| 11,127,649 B2 * | 9/2021 | Shimizu | H05K 5/0217 |
| 11,445,629 B2 * | 9/2022 | Hsieh | H05K 7/12 |
| 11,547,018 B2 * | 1/2023 | Muto | H05K 5/0008 |
| 11,570,924 B2 * | 1/2023 | Lyons | G06F 3/0619 |
| 2012/0250279 A1 * | 10/2012 | Harashima | H05K 1/144 361/760 |
| 2015/0264834 A1 * | 9/2015 | Ellis | H05K 7/20145 361/690 |
| 2018/0270943 A1 * | 9/2018 | Suzuki | G06F 1/187 |
| 2021/0385956 A1 * | 12/2021 | Cinar | H05K 5/026 |
| 2022/0248554 A1 * | 8/2022 | Suzuki | G06F 1/187 |

* cited by examiner

*Primary Examiner* — Rockshana D Chowdhury
(74) *Attorney, Agent, or Firm* — McClure, Qualey & Rodack, LLP

(57) ABSTRACT

An electronic device with storage functionality is provided. The electronic device includes a first housing member, a first circuit board, a second housing member and a second circuit board. The first circuit board is connected to the first housing member. The second circuit board is coupled to the first circuit board and is parallel to the first circuit board. The first housing member includes two hooks, and the hooks are wedged against the first edge of the second circuit board.

10 Claims, 6 Drawing Sheets

ELECTRONIC DEVICE WITH STORAGE FUNCTIONALITY

CROSS REFERENCE TO RELATED APPLICATIONS

This application claims priority of China Patent Application No. 202121067311.1, filed on May 18, 2021, the entirety of which is incorporated by reference herein.

BACKGROUND OF THE INVENTION

Field of the Invention

The present invention relates to an electronic device, and in particular to an electronic device with a storage function.

Description of the Related Art

Conventional electronic devices with a storage function (such as a solid-state disk), commonly have two or more circuit boards. The circuit boards are affixed to the housing of the electronic device by bolts. The housing of the electronic device includes a first housing member and a second housing member. The first housing member is combined to the second housing member by bolts. Conventionally, to sufficiently affix the first housing member, the second housing member and the circuit boards, a large number of bolts are required (usually more than 10 bolts). The conventional electronic device therefore costs more, and the assembly process is more complex.

BRIEF SUMMARY OF THE INVENTION

Embodiments of the invention are provided to address the aforementioned difficulty.

In one embodiment, an electronic device with storage functionality is provided. The electronic device includes a first housing member, a first circuit board, a second housing member and two main fastening bolts. The first housing member includes two first fastening stages and two first restriction stages, wherein each first restriction stage comprises a first restriction post. The first circuit board is connected to the first housing member, wherein the first circuit board comprises two first fastening holes and two first positioning holes, the first restriction posts pass through the first positioning holes to restrict the first circuit board. The second housing member includes a housing outer surface, two second fastening stages and two housing through holes, each housing through hole passes through the housing outer surface and the corresponding second fastening stage. Each main fastening bolt passes through one of the housing through holes and one of the first fastening holes, and connects one of the first fastening stages to one of the second fastening stages, and the first circuit board is partially sandwiched between the first fastening stages and the second fastening stages.

In one embodiment, the electronic device further includes a second circuit board, wherein the second circuit board is coupled to the first circuit board and is parallel to the first circuit board.

In one embodiment, the first housing member comprises two hooks, and the hooks are wedged against the first edge of the second circuit board.

In one embodiment, the electronic device further includes a flexible cable, wherein the first circuit board is connected to the second circuit board by the flexible cable, the flexible cable is connected to a second edge of the second circuit board, and the second edge is opposite the first edge.

In one embodiment, each hook has a guiding inclined surface.

In one embodiment, the first housing member comprises two first supporting posts, each first supporting post comprises a first post top, the hook is formed on the first post top, and the second circuit board abuts the first post tops and is supported by the first post tops.

In one embodiment, the first housing member comprises two second supporting posts, each second supporting post comprises a second post top, and the second circuit board abuts the second post tops and is supported by the second post tops.

In one embodiment, the second housing member further comprises a restriction rib, and at least a portion of the second circuit board is sandwiched between the restriction rib and the second supporting posts.

In one embodiment, the first circuit board further comprises a connection port, and the connection port and the first fastening holes are located on the same side of the first circuit board.

In one embodiment, the first housing member further comprises at least one first wedging portion, the second housing member further comprises at least one second wedging portion, the first wedging portion is wedged against the second wedging portion, and the housing through holes are located on the opposite side of the second housing member from the second wedging portion.

In one embodiment, an electronic device with storage functionality is provided. The electronic device includes a first housing member, a first circuit board, a second housing member and a second circuit board. The first circuit board is connected to the first housing member. The second circuit board is coupled to the first circuit board and is parallel to the first circuit board. The first housing member comprises two hooks, and the hooks are wedged against the first edge of the second circuit board.

In the electronic device of the embodiment of the invention, only two main fastening bolts are utilized to accomplish the combination between the first housing member and the second housing member. There are fewer bolts than in the conventional art, which greatly simplifies the assembly process. Additionally, the circuit boards are well positioned by the supporting posts, the restriction posts and the hooks. The electronic device of the embodiment of the invention has a lower cost and can be easily assembled, and the first housing member, the second housing member and the circuit boards are sufficiently affixed.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
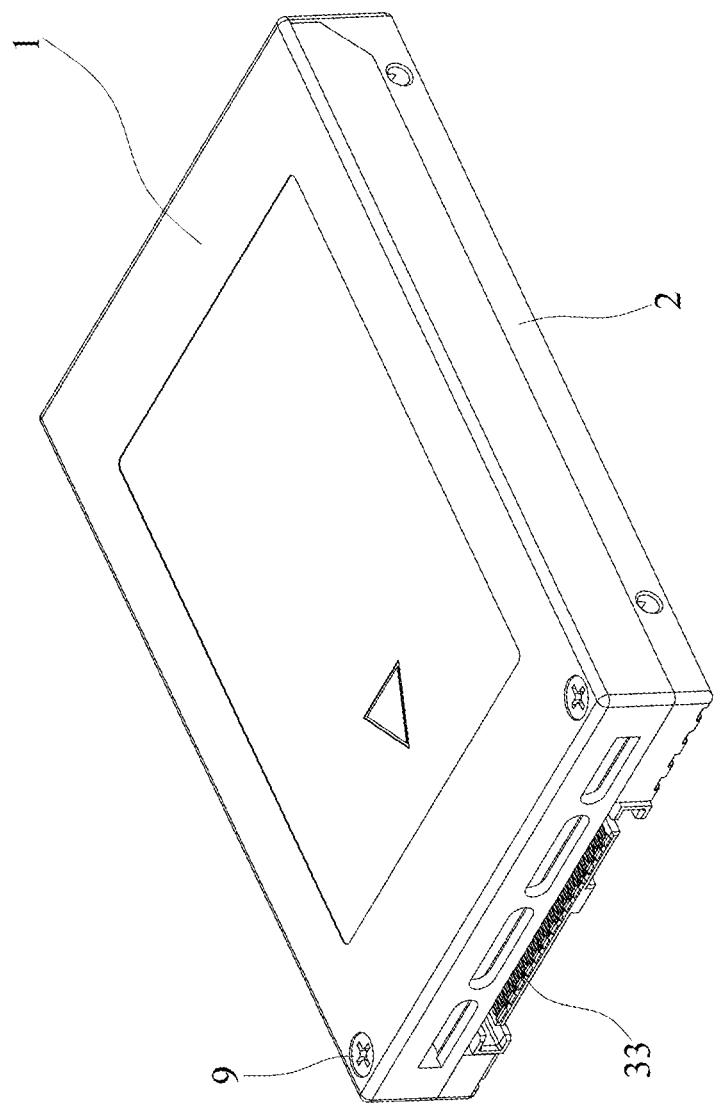
FIG. 1A is a perspective view of an electronic device of the embodiment of the invention.
Figure 1B:
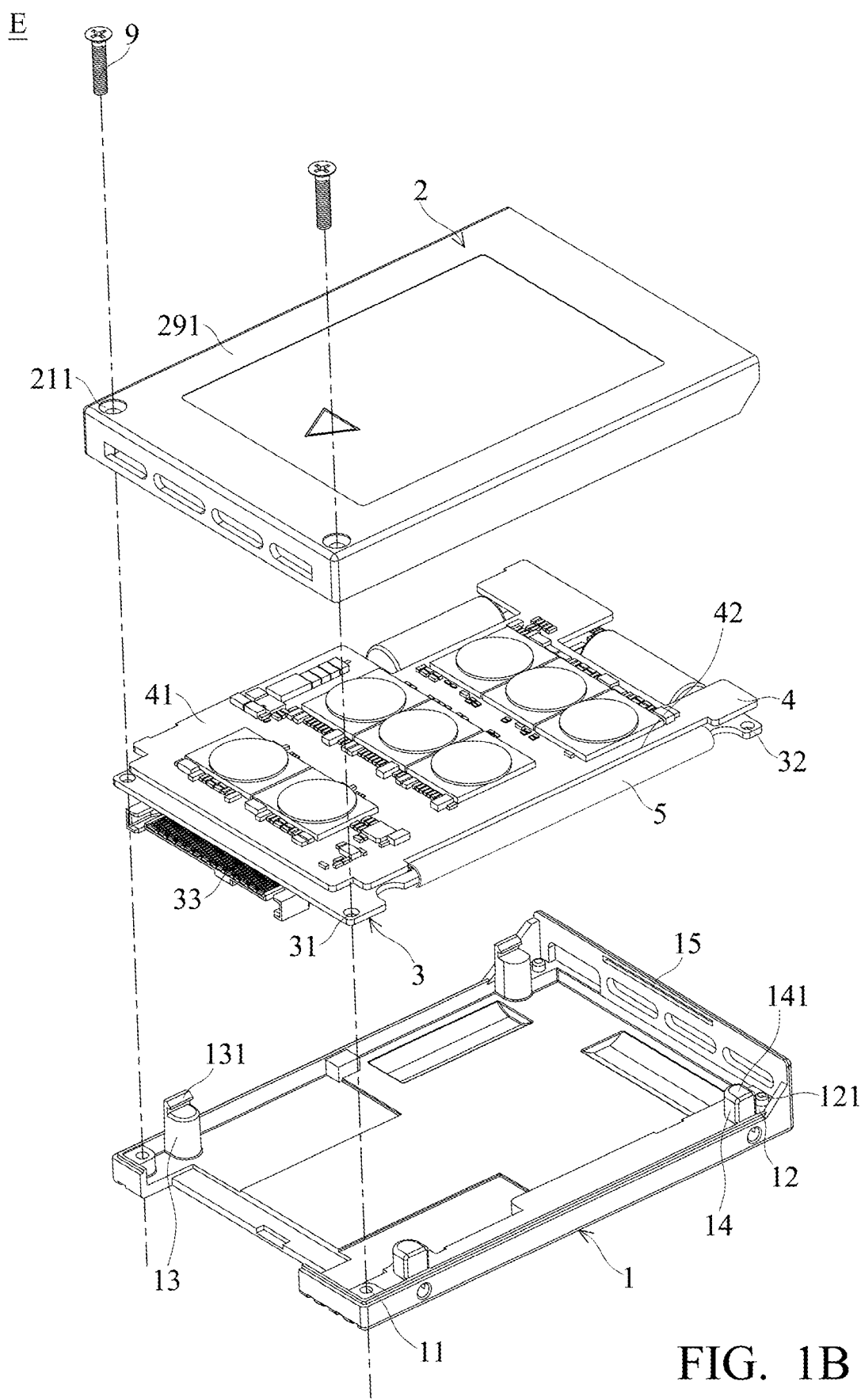
FIG. 1B is an exploded view of the electronic device of the embodiment of the invention.
Figure 2:
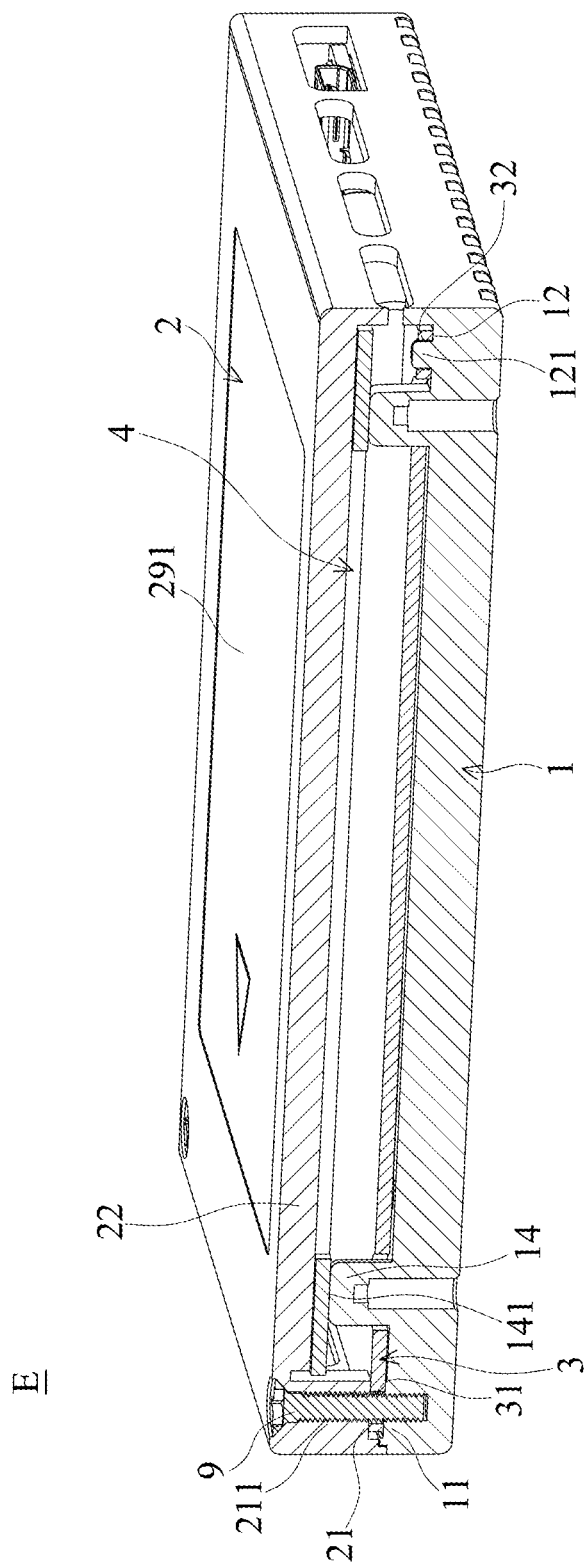
FIG. 2 is a cross sectional view of the electronic device of the embodiment of the invention.

FIG. 1A is a perspective view of an electronic device of the embodiment of the invention. FIG. 1B is an exploded view of the electronic device of the embodiment of the invention. FIG. 2 is a cross sectional view of the electronic device of the embodiment of the invention. With reference to FIGS. 1A, 1B and 2, the electronic device with storage functionality of the embodiment of the invention includes a first housing member 1, a first circuit board 3, a second housing member 2 and two main fastening bolts 9. The first housing member 1 includes two first fastening stages 11 and two first restriction stages 12. Each first restriction stage 12 comprises a first restriction post 121. The first circuit board 3 is connected to the first housing member 1. The first circuit board 3 comprises two first fastening holes 31 and two first positioning holes 32. The first restriction posts 121 pass through the first positioning holes 32 to restrict the first circuit board 3. The second housing member 2 includes a housing outer surface 291, two second fastening stages 21 and two housing through holes 211. Each housing through hole 211 passes through the housing outer surface 291 and the corresponding second fastening stage 21. Each main fastening bolt 9 passes through one of the housing through holes 211 and one of the first fastening holes 31, and connects one of the first fastening stages 11 to one of the second fastening stages 21. The first circuit board 3 is partially sandwiched between the first fastening stages 11 and the second fastening stages 21, and is restricted thereby.

In one embodiment, the first fastening holes 31 and the first positioning holes 32 can be circular holes or oval holes to facilitate the assembly process.

With reference to FIGS. 1B and 2, in one embodiment, the electronic device E further includes a second circuit board 4, wherein the second circuit board 4 is coupled to the first circuit board 3 and is parallel to the first circuit board 3.

Figure 3A:
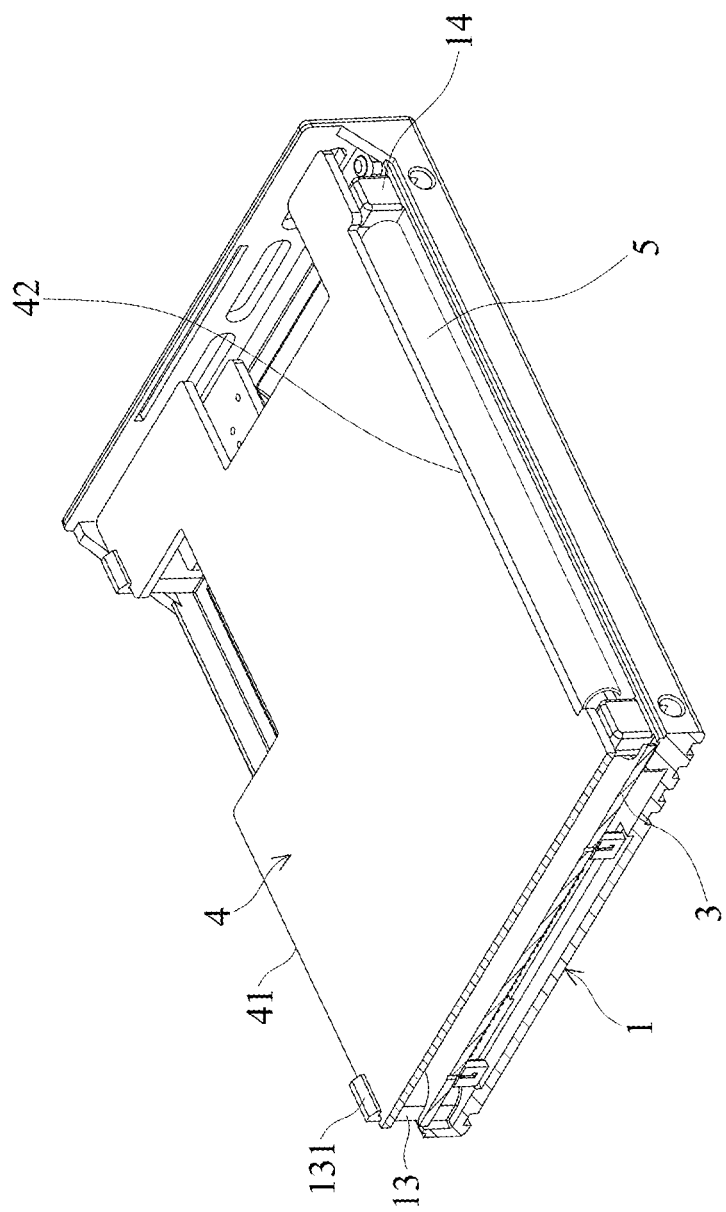
FIG. 3A shows the hooks wedged against the second circuit board of the embodiment of the invention.
Figure 3B:
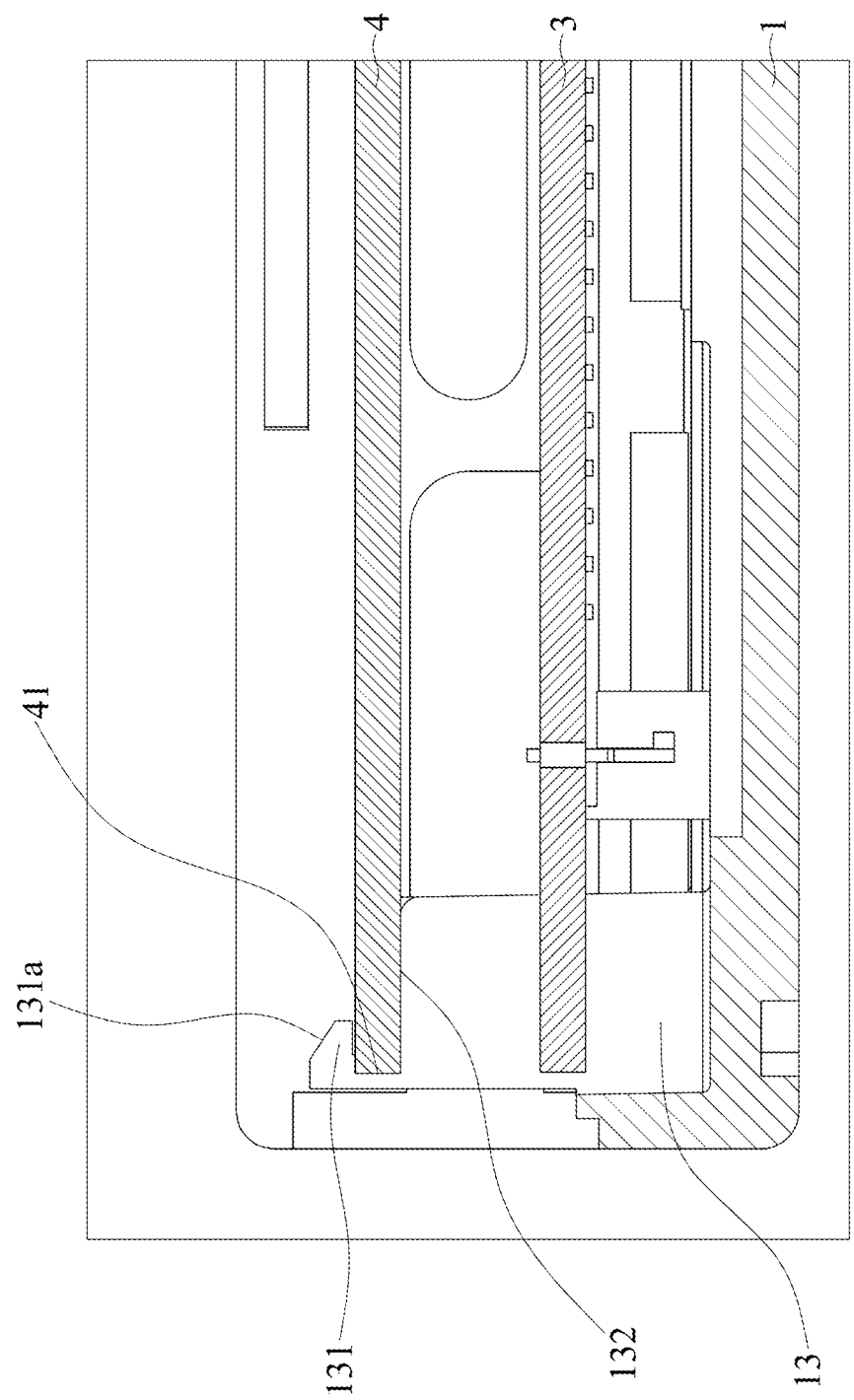
FIG. 3B is a side view of the hook of the embodiment of the invention.

FIG. 3A shows the hooks wedged against the second circuit board of the embodiment of the invention. FIG. 3B is a side view of the hook of the embodiment of the invention. With reference to FIGS. 1B, 3A and 3B, in one embodiment, the first housing member 1 comprises two hooks 131. The hooks 131 are wedged against a first edge 41 of the second circuit board 4 to restrict the second circuit board 4.

With reference to FIGS. 1B and 3A, in one embodiment, the electronic device E further includes a flexible cable 5. The first circuit board 3 is connected to the second circuit board 4 by the flexible cable 5. The flexible cable 5 is connected to a second edge 42 of the second circuit board 4, and the second edge 42 is opposite the first edge 41.

With reference to FIG. 3B, in one embodiment, each hook 131 has a guiding inclined surface 131a. The second circuit board 4 can slide along the guiding inclined surface 131a to be smoothly wedged against the hook 131.

With reference to FIGS. 1B and 3A, in one embodiment, the first housing member 1 comprises two first supporting posts 13. Each first supporting post 13 comprises a first post top 132. The hook 131 is formed on the first post top 132. The second circuit board 4 abuts the first post tops 132 and is supported by the first post tops 132.

With reference to FIGS. 1B, 2 and 3A, in one embodiment, the first housing member 1 comprises two second supporting posts 14. Each second supporting post 14 comprises a second post top 141. The second circuit board 4 abuts the second post tops 141 and is supported by the second post tops 141.

Figure 4:
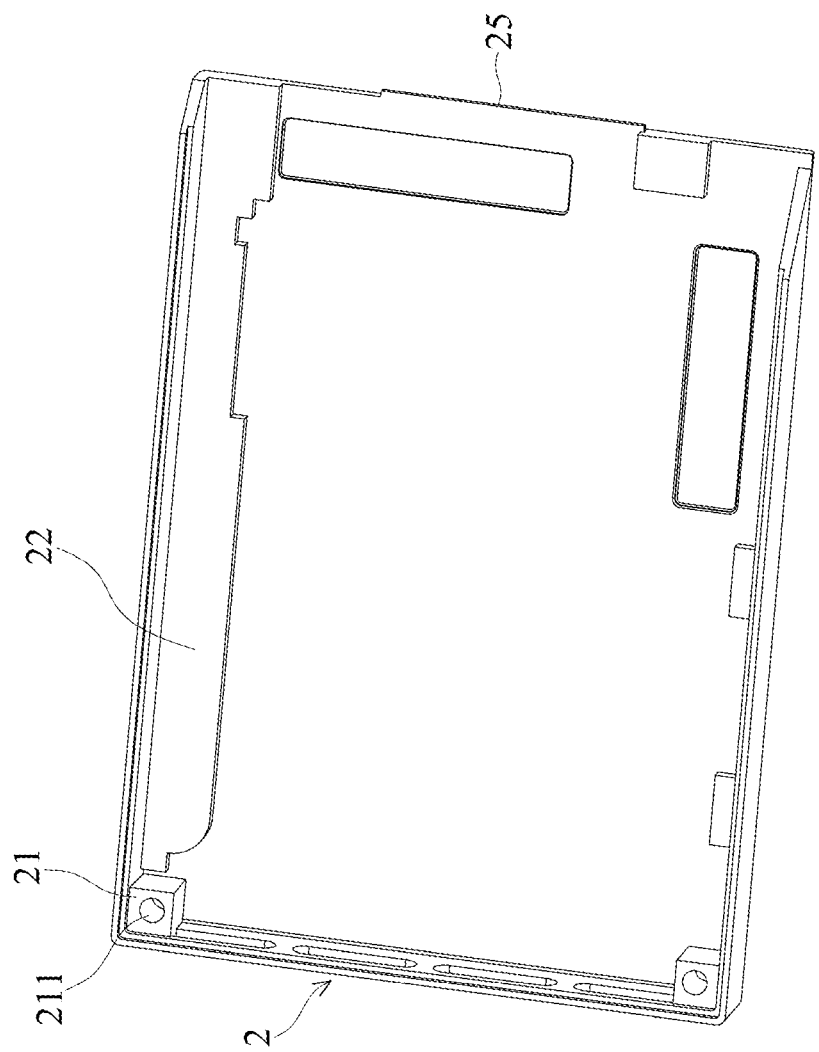
FIG. 4 shows the details of the second housing member of the embodiment of the invention.

FIG. 4 shows the details of the second housing member of the embodiment of the invention. With reference to FIGS. 2 and 4, in one embodiment, the second housing member 2 further comprises a restriction rib 22. At least a portion of the second circuit board 4 is sandwiched between the restriction rib 22 and the second supporting posts 14, and the second circuit board 4 is restricted thereby.

With reference to FIGS. 1A and 1B, in one embodiment, the first circuit board 3 further comprises a connection port 33. The connection port 33 and the first fastening holes 31 are located on the same side of the first circuit board 3. The connection port 33 often bears external force during plugging and unplugging, and the connection port 33 and the first fastening holes 31 are therefore located on the same side of the first circuit board 3 to achieve improved structural strength.

With reference to FIGS. 1B and 4, in one embodiment, the first housing member 1 further comprises at least one first wedging portion 15, and the second housing member 2 further comprises at least one second wedging portion 25. The first wedging portion 15 is wedged against the second wedging portion 25. The housing through holes 211 are located on the opposite side of the second housing member 2 from the second wedging portion 25. The first wedging portion 15 and the second wedging portion 25 provide improved combination between the first housing member 1 and the second housing member 2.

With reference to FIGS. 1A and 1B, in another embodiment, an electronic device E with storage function is provided. The electronic device E includes a first housing member 1, a first circuit board 3, a second housing member 2 and a second circuit board 4. The first circuit board 3 is connected to the first housing member 1. The second circuit board 4 is coupled to the first circuit board 3 and is parallel to the first circuit board 3. The first housing member 1 comprises two hooks 131, and the hooks 131 are wedged against a first edge 41 of the second circuit board 4.

In the electronic device of the embodiment of the invention, only two main fastening bolts are utilized to accomplish the combination between the first housing member and the second housing member. There are fewer bolts than in the conventional art, which greatly simplifies the assembly process. Additionally, the circuit boards are well positioned by the supporting posts, the restriction posts and the hooks. The electronic device of the embodiment of the invention has a lower cost and can be easily assembled, and the first housing member, the second housing member and the circuit boards are sufficiently affixed.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with storage functionality, comprising:
   a first housing member, comprising two first fastening stages and two first restriction stages, wherein each first restriction stage comprises a first restriction post;
   a first circuit board, connected to the first housing member, wherein the first circuit board comprises two first fastening holes and two first positioning holes, and the first restriction posts pass through the first positioning holes to restrict the first circuit board;
   a second housing member, comprising a housing outer surface, two second fastening stages and two housing through holes, and each housing through hole passes through the housing outer surface and the corresponding second fastening stage;
   two main fastening bolts, wherein each main fastening bolt passes through one of the housing through holes and one of the first fastening holes, and connects one of the first fastening stages to one of the second fastening stages, and the first circuit board is partially sandwiched between the first fastening stages and the second fastening stages; and
   a second circuit board, wherein the second circuit board is coupled to the first circuit board and is parallel to the first circuit board, wherein the first housing member comprises two hooks, and the hooks are wedged against a first edge of the second circuit board,
   wherein the first housing member comprises two first supporting posts, each first supporting post comprises a first post top, the hook is formed on the first post top, and the second circuit board abuts the first post tops and is supported by the first post tops.

2. The electronic device as claimed in claim 1, further comprising a flexible cable, wherein the first circuit board is connected to the second circuit board by the flexible cable, the flexible cable is connected to a second edge of the second circuit board, and the second edge is opposite the first edge.

3. The electronic device as claimed in claim 1, wherein each hook has a guiding inclined surface.

4. The electronic device as claimed in claim 1, wherein the first housing member comprises two second supporting posts, each second supporting post comprises a second post top, and the second circuit board abuts the second post tops and is supported by the second post tops.

5. The electronic device as claimed in claim 4, wherein the second housing member further comprises a restriction rib, and at least a portion of the second circuit board is sandwiched between the restriction rib and the second supporting posts.

6. The electronic device as claimed in claim 1, wherein the first circuit board further comprises a connection port, and the connection port and the first fastening holes are located on the same side of the first circuit board.

7. The electronic device as claimed in claim 1, wherein the first housing member further comprises at least one first wedging portion, the second housing member further comprises at least one second wedging portion, the first wedging portion is wedged against the second wedging portion, and the housing through holes are located on the opposite side of the second housing member from the second wedging portion.

8. An electronic device with storage functionality, comprising:
   a first housing member;
   a first circuit board, connected to the first housing member;
   a second housing member;
   a second circuit board, wherein the second circuit board is coupled to the first circuit board and is parallel to the first circuit board, wherein the first housing member comprises two hooks, and the hooks are wedged against the first edge of the second circuit board; and
   a flexible cable, wherein the first circuit board is connected to the second circuit board by the flexible cable, the flexible cable is connected to a second edge of the second circuit board, and the second edge is opposite the first edge, wherein the first housing member comprises two first supporting posts, each first supporting post comprises a first post top, the hook is formed on the first post top, and the second circuit board abuts the first post tops and is supported by the first post tops.

9. The electronic device as claimed in claim 8, wherein the first housing member comprises two second supporting posts, each second supporting post comprises a second post top, and the second circuit board abuts the second post tops and is supported by the second post tops.

10. The electronic device as claimed in claim 9, wherein the second housing member further comprises a restriction rib, and at least a portion of the second circuit board is sandwiched between the restriction rib and the second supporting posts.

* * * * *